(12) United States Patent
Hagiwara et al.

(10) Patent No.: US 8,534,975 B2
(45) Date of Patent: Sep. 17, 2013

(54) SUBSTRATE TRANSPORT APPARATUS AND METHOD FOR MANUFACTURING MAGNETIC RECORDING MEDIUM

(75) Inventors: Itaru Hagiwara, Hino (JP); Naoyuki Nozawa, Inagi (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 666 days.

(21) Appl. No.: 12/603,722

(22) Filed: Oct. 22, 2009

(65) Prior Publication Data

US 2010/0101075 A1 Apr. 29, 2010

(30) Foreign Application Priority Data

Oct. 28, 2008 (JP) ................................. 2008-276821
Oct. 6, 2009 (JP) ................................. 2009-232524

(51) Int. Cl.
*H01L 21/677* (2006.01)

(52) U.S. Cl.
USPC .......................................... 414/217; 414/939

(58) Field of Classification Search
USPC .................................................. 414/217, 939
See application file for complete search history.

(56) References Cited

U.S. PATENT DOCUMENTS

| 6,206,176 B1 * | 3/2001 | Blonigan et al. ............. 198/619 |
| 6,213,704 B1 | 4/2001 | White et al. |
| 6,290,824 B1 | 9/2001 | Ishikawa et al. |
| 6,919,001 B2 | 7/2005 | Fairbairn et al. |
| 7,296,673 B2 * | 11/2007 | Blonigan et al. ............. 198/369.6 |
| 2005/0115830 A1 | 6/2005 | Furukawa et al. |
| 2006/0278497 A1 | 12/2006 | White et al. |
| 2009/0056878 A1 | 3/2009 | Nozawa et al. |

FOREIGN PATENT DOCUMENTS

| JP | 2002-516240 A | 6/2002 |
| JP | 2004-018922 A | 1/2004 |
| JP | 2005-066753 A | 3/2005 |
| JP | 2005-138010 A | 6/2005 |
| JP | 2008-027572 A | 2/2008 |
| WO | 99/60612 A1 | 11/1999 |
| WO | WO 2004/072959 A2 | 8/2004 |

OTHER PUBLICATIONS

Notification of the First Office Action dated Dec. 7, 2010, issued in the corresponding Chinese Patent Application No. 200910208119.7, and an English Translation thereof.
Search and Examination Report dated Jul. 15, 2012, issued in corresponding Singapore Patent Application No. 200906792-7. (18 pages).
Office Action dated May 17, 2013 issued by the Japanese Patent Office in corresponding Japanese Patent Application No. 2009-232524, and an English translation thereof.

* cited by examiner

*Primary Examiner* — Jonathan Snelting
(74) *Attorney, Agent, or Firm* — Buchanan Ingersoll & Rooney PC

(57) ABSTRACT

A substrate transport apparatus comprises chambers connected to each other through a gate valve, a transport mechanism configured to open the gate valve and to transport a carrier between the chambers along a transport path, a sensor configured to detect the carrier before the carrier reaches a stop position in the chamber, and a controller configured to cause the gate valve to start closing based on the detection signal from the sensor.

2 Claims, 10 Drawing Sheets

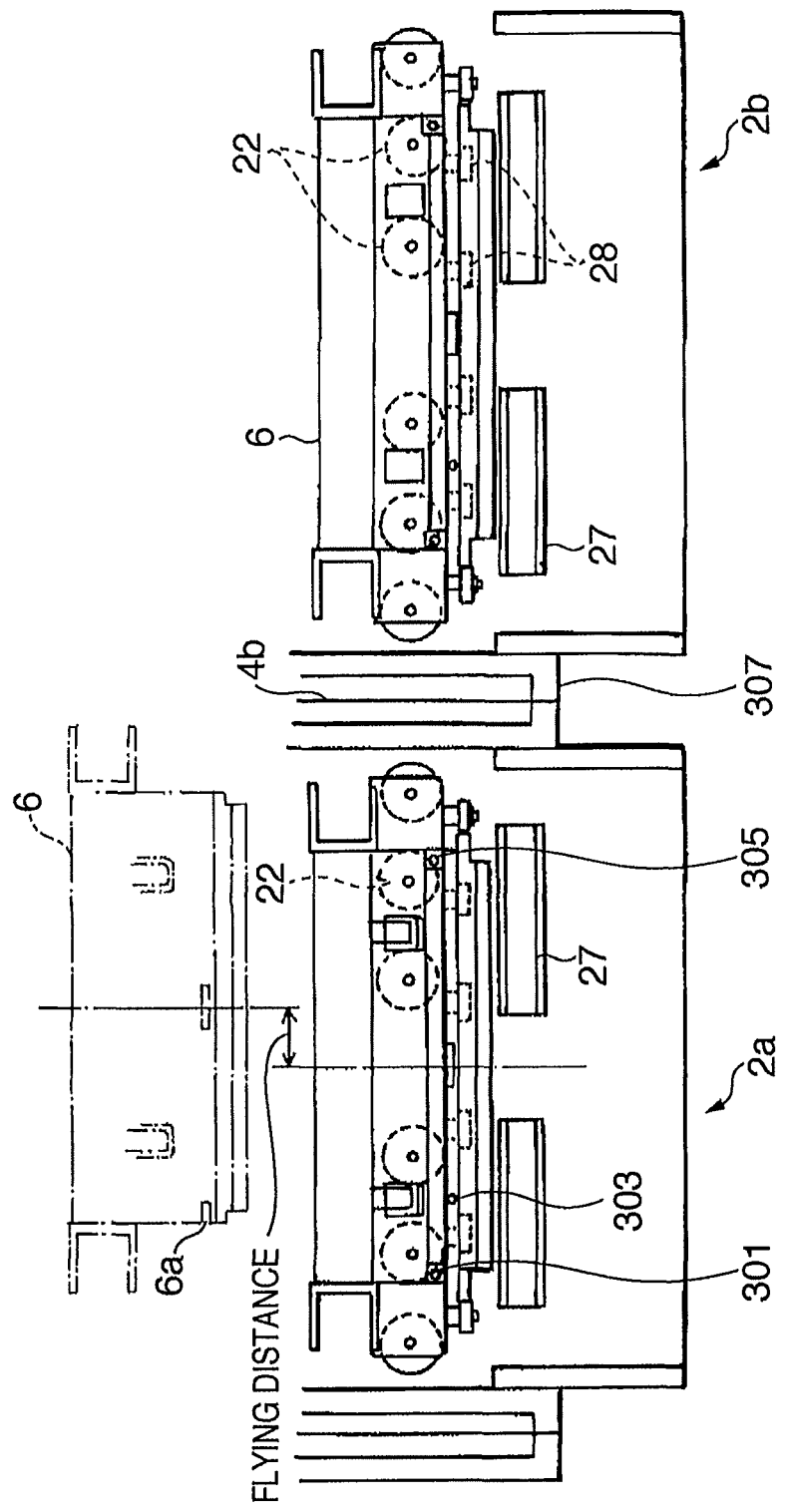

SUBSTRATE TRANSPORT APPARATUS AND METHOD FOR MANUFACTURING MAGNETIC RECORDING MEDIUM

BACKGROUND OF THE INVENTION

1. Field of the Invention

The present invention relates to a substrate transport apparatus which transports a substrate along a transport path running through chambers, and a method for manufacturing a magnetic recording medium.

2. Description of the Related Art

Japanese Patent Laid-Open No. 2008-027572 discloses a disk processing system. A substrate for, for example, a magnetic disk enters the system through a loading zone and is mounted in a carrier. The substrate in the carrier continuously moves through processing chambers at one level, and then moves to another level by a lift or elevator. After that, the substrate continuously moves through the system at the other level and is output in an unloading zone.

It is demanded to further improve the throughput and productivity of a substrate processing system which transports and processes a substrate for, for example, a magnetic disk, thereby manufacturing products in large quantities, as described in Japanese Patent Laid-Open No. 2008-027572. This requires shortening the processing time (takt time) in each processing chamber.

SUMMARY OF THE INVENTION

It is an object of the present invention to provide a substrate transport apparatus which can improve the throughput and the productivity by shortening the processing time in a processing chamber.

According to the first aspect of the present invention, there is provided a substrate transport apparatus comprising chambers connected to each other through a gate valve, a transport mechanism configured to open the gate valve and to transport a carrier between the chambers along a transport path, a sensor configured to detect the carrier before the carrier reaches a stop position in the chamber, and a controller configured to cause the gate valve to start closing based on the detection signal from the sensor.

According to the second aspect of the present invention, there is provided a substrate transport apparatus comprising chambers connected to each other through a gate valve, a transport mechanism configured to open the gate valve and transport a carrier between the chambers along a transport path, and a controller configured to cause the gate valve to start closing before the carrier reaches a stop position in the chamber based on an operating time of the transport mechanism.

According to the third aspect of the present invention, there is provided a substrate transport apparatus comprising chambers connected to each other through a gate valve, a transport mechanism configured to open the gate valve and transport a carrier between the chambers along a transport path, and a controller configured to cause the gate valve to start closing before the carrier reaches a stop position in the chamber.

According to the present invention, it is possible to shorten the processing time in a processing chamber by starting closing a gate valve before a carrier reaches the stop position, thus improving the throughput and the productivity.

Further features of the present invention will become apparent from the following description of exemplary embodiments with reference to the attached drawings.

BRIEF DESCRIPTION OF THE DRAWINGS

FIG. 3 is a schematic sectional view showing processing chambers 2a and 2b connected to each other by vacuum suction through a gate valve 4b when viewed from the horizontal direction;

DESCRIPTION OF THE EMBODIMENTS

Figure 1:
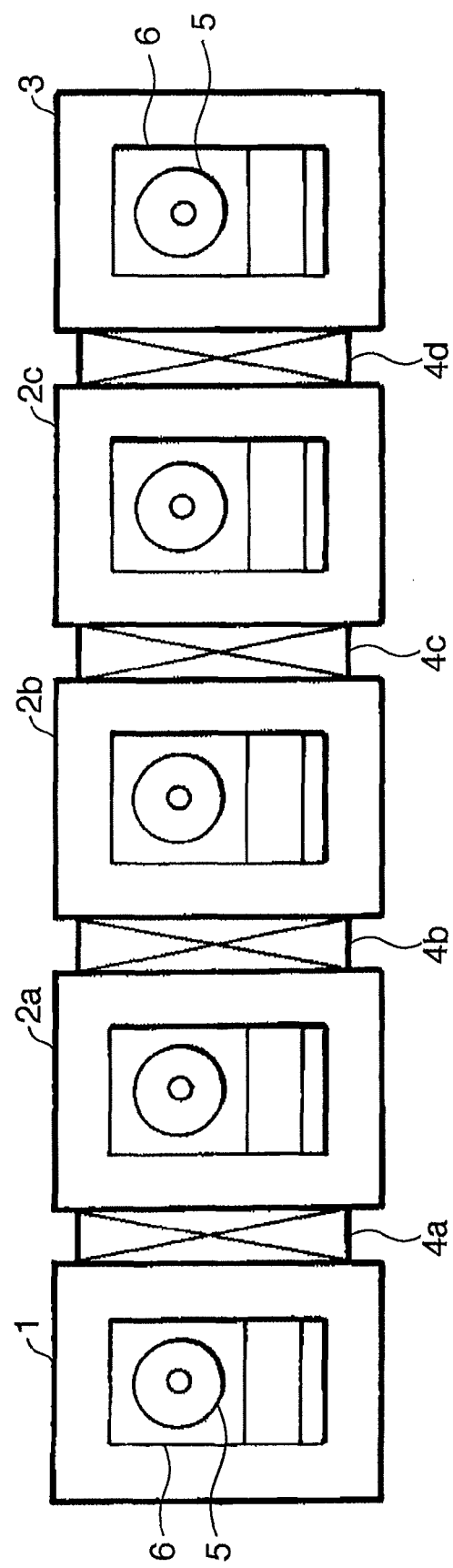
FIG. 1 is a view illustrating an example of the arrangement of an in-line vacuum processing apparatus including a plurality of processing chambers connected in series according to a preferred embodiment of the present invention.

Best modes for carrying out the invention will be described in detail below with reference to the accompanying drawings. A substrate transport apparatus according to the present invention is suitably applicable to, for example, a vacuum processing apparatus which performs processing such as film formation for a substrate for, for example, a magnetic disk. FIG. 1 schematically shows the arrangement of an in-line vacuum processing apparatus including a plurality of processing chambers connected in series as a vacuum processing apparatus to which a substrate transport apparatus according to the present invention is applied.

The in-line vacuum processing apparatus includes a load lock chamber 1, processing chambers 2a to 2c, and a load lock chamber 3 which are connected to each other through gate valves 4a to 4d. A carrier 6 which supports a substrate 5 for, for example, a magnetic disk is transported in the horizontal direction by, for example, a carrier transport mechanism (not shown) provided in each chamber. The carrier is transported along the transport path between the chambers, connected to each other through the gate valves, after the gate valves are opened. Although the number of processing chambers is three in FIG. 1, the present invention is not limited to this.

A substrate 5 transported externally is transferred to the carrier 6 on standby in the load lock chamber 3 by a substrate loading mechanism (not shown), and is supported by the carrier 6. The carrier 6 which supports the substrate 5 is transported to the processing chambers 2c, 2b, and 2a in this order, processed in each processing chamber, and transported to the load lock chamber 1. After that, the substrate 5 is removed from the carrier 6 by a substrate unloading mechanism (not shown), unloaded outside the in-line vacuum processing apparatus, and delivered to the next process. The carrier 6 from which the substrate has been removed returns into the lock chamber 3 along the return route (not shown), and stands by for transportation of the next substrate.

An example in which the carrier 6 is transported from the processing chamber 2b to the processing chamber 2a will be explained in the following embodiment.

Figure 2A:
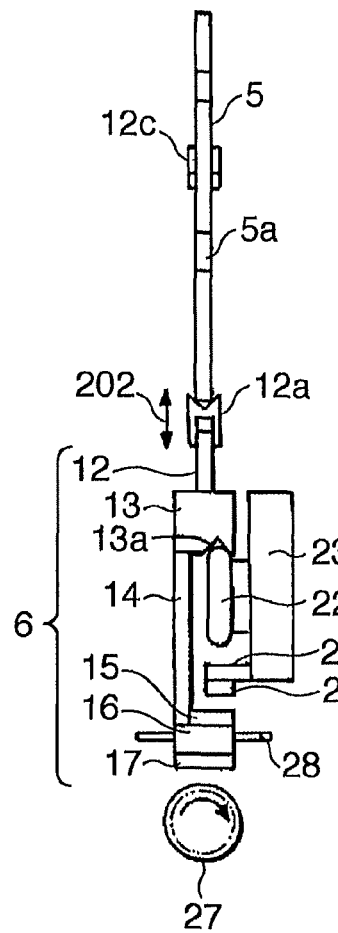
FIGS. 2A and 2B are views showing the schematic arrangement of the main part of the substrate transport apparatus according to the preferred embodiment of the present invention.
Figure 2B:
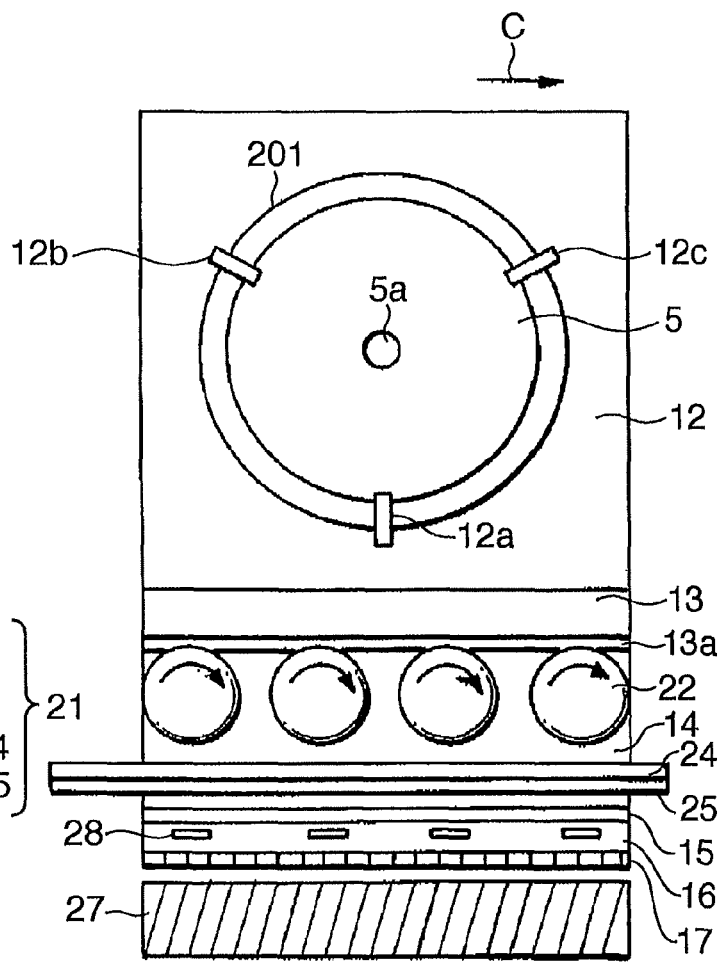

FIGS. 2A and 2B are views schematically showing the arrangement of the main part of the substrate transport apparatus according to the preferred embodiment of the present invention. FIG. 2A is a side view showing the state in which the carrier 6 holds the substrate 5, and FIG. 2B is a front view in this state. FIGS. 2A and 2B do not show members such as a processing chamber.

As shown in FIGS. 2A and 2B, the carrier 6 includes a holder portion 12, an engaging portion 13 having a pyramidal or curved groove 13a formed in it, a magnetic yoke 16, and a connecting portion 14 which connects the engaging portion 13 and the magnetic yoke 16. The carrier 6 also includes a first magnet 15 and magnet group 17.

An opening portion 201 having a diameter larger than that of the substrate 5 is formed at the center of the holder portion 12. Clamps 12a, 12b, and 12c hold the substrate 5 while the substrate 5 stands such that its principal surface (upper surface) is parallel to the vertical direction. The clamp 12a is supported by the holder portion 12 so as to be movable in the direction indicated by a two-headed arrow 202 (vertical direction), and is pressed against the periphery of the substrate 5 by a spring. In holding the substrate 5 by the holder portion 12, the periphery of the substrate 5 transported by a robot arm (not shown) is pressed against the groove portions in the clamps 12b and 12c while the clamp 12a is pushed downward.

When the clamp 12a is released, the force of the above-mentioned spring causes the groove portion in the clamp 12a to press the periphery of the substrate 5 upward. In this way, the substrate 5 is fixed on the holder portion 12 so as to be clamped by the clamps 12a, 12b, and 12c.

A carrier support mechanism 21 includes a plurality of guide rollers 22 which form a transport path, a base portion 23 which supports the plurality of guide rollers 22, and a magnetic yoke 24 bonded to the lower end of the base portion 23. The magnetic yoke 24 vertically faces the magnetic yoke 16 mounted in the carrier 6. The magnetic yoke 16 includes, in the region where it faces the magnetic yoke 24, the first magnet 15 located such that its pole points in the upward vertical direction. The magnetic yoke 24 facing the magnetic yoke 16 includes a second magnet 25 located on it with a desired spacing from the first magnet 15 so that the second magnet 25 magnetically attracts the first magnet 15.

The plurality of guide rollers 22 are linearly arrayed on the base portion 23 at a predetermined interval in the direction in which the carrier 6 is transported (the direction indicated by an arrow C). The plurality of guide rollers 22 are located so as to support the weight of the carrier 6 upon engaging with the groove 13a in the engaging portion 13. The engaging portion 13 and the guide rollers 22 are not fixed to each other. Hence, the carrier 6 can smoothly slide in the horizontal direction parallel to the principal surface of the substrate 5 by rotating the guide rollers 22.

The base portion 23 is fixed on the inner wall of the vacuum chamber (each chamber shown in FIG. 1) through, for example, a stay member (not shown).

In this embodiment, the magnetic yoke 24 made of a magnetic material is located on the substrate side of the second magnet 25 as a magnet closer to the substrate 5 than the first magnet 15, as shown in FIG. 2A. The magnetic yoke 24 supports the second magnet 25, and suppresses any leakage of the magnetic field from the second magnet 25 to the upper side of the second magnet 25, thereby forming a stable magnetic field below the second magnet 25. Moreover, the magnetic yoke 24 can suppress the magnetic fields of the first magnet 15 and second magnet 25 from adversely affecting a plasma space in which the substrate 5 can be set, and can also suppress the adverse effect of thermal radiation from the plasma space.

The magnetic yoke 16 supports the first magnet 15 and suppresses any leakage of the magnetic field from the first magnet 15 to its lower side, thereby forming a stable magnetic field in the upward vertical direction from the first magnet 15. In addition, the magnetic yoke 16 supports the magnet group 17 on the side opposite to the first magnet 15, and suppresses any leakage of the magnetic field from the magnet group 17 to its upper side, thereby forming a stable magnetic field below the magnet group 17.

In this embodiment, to stably transport the carrier 6 standing upright, side rollers 28 are set in the horizontal direction so as to clamp the magnetic yoke 16 below the carrier 6. The side rollers 28 are fixed on the inner wall of the vacuum chamber (each chamber shown in FIG. 1) through, for example, a stay member (not shown).

In this embodiment, the carrier transport mechanism uses the carrier-side magnet group 17 mounted on the side of the carrier 6, and a magnetic screw 27. The magnet group 17 includes north- and south-pole magnets which are alternately arrayed at a predetermined interval in the direction in which the carrier 6 is transported. On the other hand, the magnetic screw 27 is a cylindrical member having a central shaft parallel to the direction in which the carrier 6 is transported, and includes north- and south-pole threads which are alternately arrayed on its surface. The pitch of the north- and south-pole threads in a direction parallel to the central shaft of the magnetic screw 27 is equal to that of the magnet group 17, and the magnetic screw 27 is located with a desired spacing from the magnet group 17.

In the above-mentioned arrangement, when the magnetic screw 27 rotates in a predetermined direction, the north- and south-pole threads facing the magnet group 17 move relative to the magnet group 17 in the direction in which the carrier 6 is transported (the direction indicated by the arrow C). With this operation, a thrust involved in movement in the direction indicated by the arrow C acts on the carrier 6 due to the attractive force/repulsive force between the south- and north-pole magnets of the magnet group 17 and the north- and south-pole threads of the magnetic screw 27. The carrier 6 is transported in the direction indicated by the arrow C.

In this embodiment, the first magnet 15 disposed in the carrier 6, and the second magnet 25 disposed in the carrier support mechanism 21 generate an attractive force in the vertical direction. For this reason, the attractive force acting between the first magnet 15 and the second magnet 25 acts in the direction in which the carrier 6 is lifted up, thus reducing the weight of the carrier 6 acting on the guide rollers 22. At this time, the carrier 6 levitates if the attractive force acting between the first magnet 15 and the second magnet 25 is too strong. To prevent this, the attractive force is controlled as needed by adjusting the magnetic force and interval between the first magnet 15 and the second magnet 25.

Also, the substrate transport apparatus according to this embodiment can include a detector and controller (neither is shown). The detector detects the magnetic force between the first magnet 15 and the second magnet 25 (or their interval). The controller controls the magnetic force acting between the first magnet 15 and the second magnet 25 (or their interval). The controller can control the attractive force by adjusting the interval between the first magnet 15 and the second magnet 25 based on the detection result obtained by the detector.

As the weight of the carrier 6 acting on the guide rollers 22 reduces in this way, the friction between the guide rollers 22 and the surface of the groove 13a in the engaging portion 13, in turn, reduces. This makes it possible to suppress the generation of particles.

Each of the first magnet 15 and second magnet 25 may be a single magnet extending in the direction in which the carrier 6 is transported, or may be a plurality of magnets arrayed at a predetermined interval in the direction in which the carrier 6 is transported.

Also, although a method which exploits a magnetic action between the magnetic screw 27 and the magnet group 17 has been exemplified as the carrier transport mechanism in this embodiment, the present invention is not limited to this. For example, the carrier transport mechanism may adopt a method which uses a linear motor or a method of converting a rotational motion by a rotary driving source such as a motor into a rectilinear motion using a mechanism such as a rack and pinion.

When the carrier transport mechanism adopts the magnetic screw scheme, the attractive force between the magnetic screw 27 and the magnet group 17 acts on the carrier transport operation. For this reason, in addition to the weight of the carrier 6, the guide rollers 22 receive the attractive force between the magnetic screw 27 and the magnet group 17.

Figure 4:
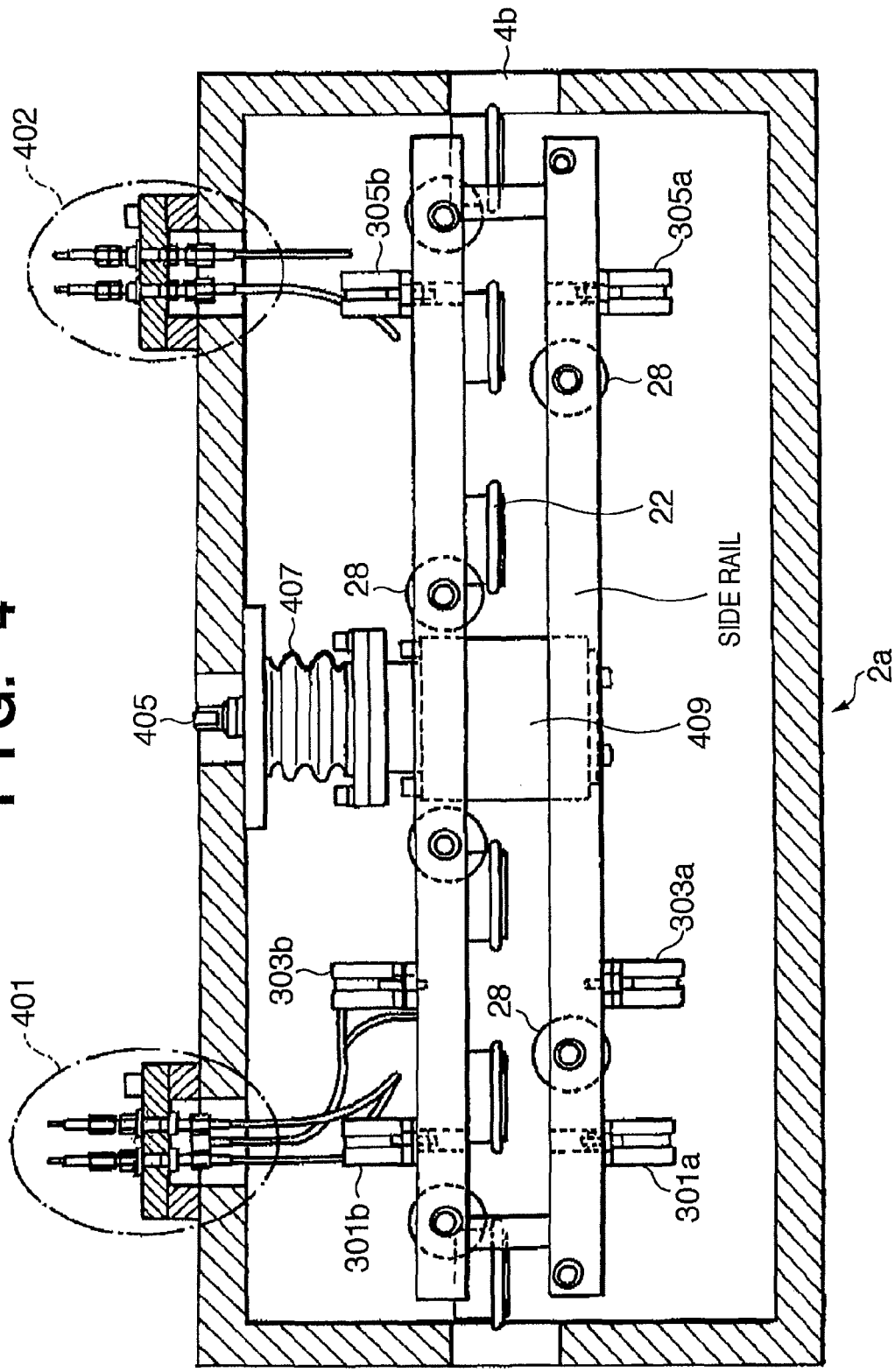
FIG. 4 is a schematic sectional view showing the processing chamber 2a when viewed from above.
Figure 5:
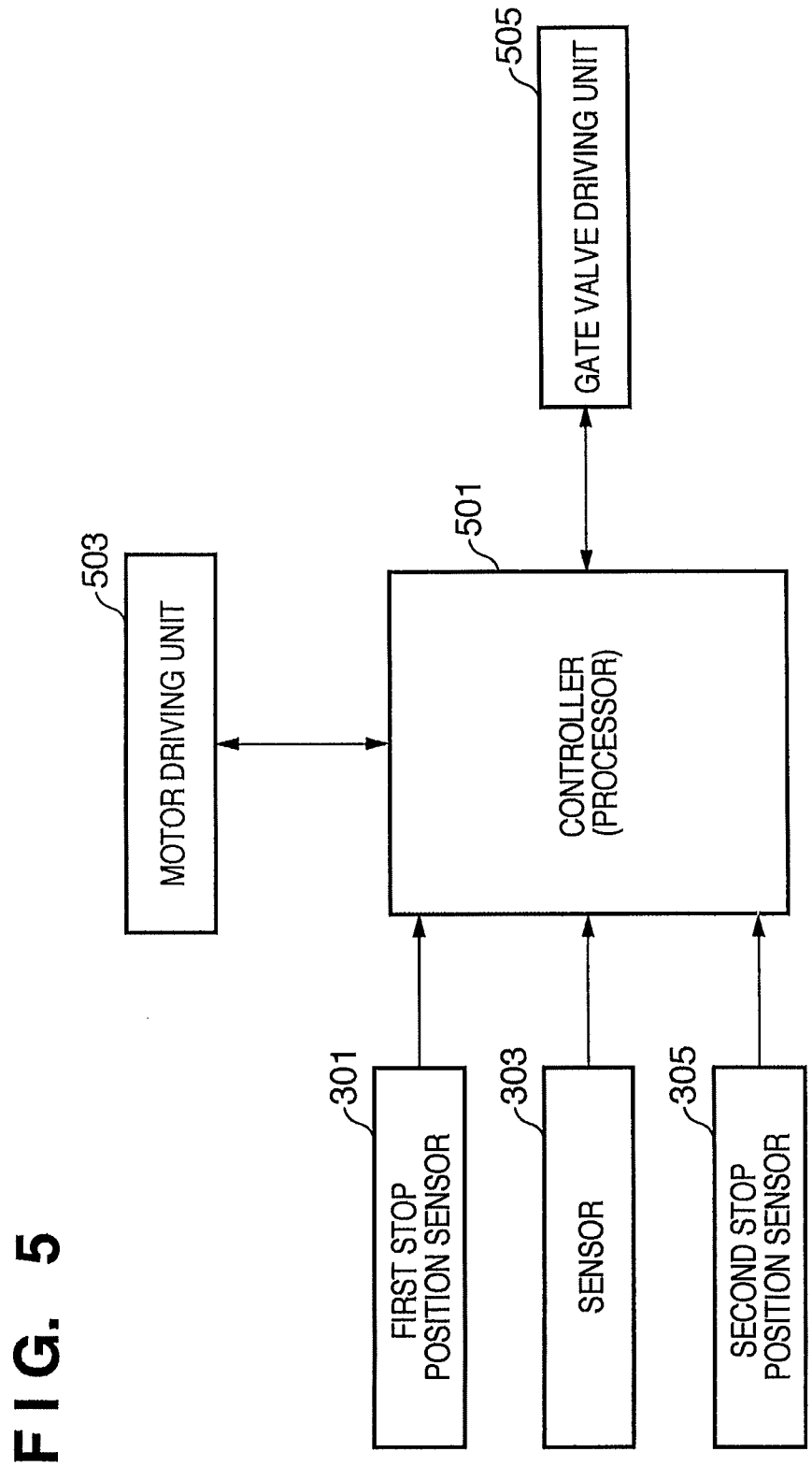
FIG. 5 is a block diagram illustrating an example of a control circuit according to the preferred embodiment of the present invention.

The arrangement of the substrate transport apparatus and a control method therefor according to the present invention will be explained in detail with reference to FIGS. 3, 4, and 5. FIG. 3 is a schematic sectional view showing the processing chambers 2a and 2b connected to each other through the gate valve 4b when viewed from the horizontal direction. FIG. 4 is a schematic sectional view showing the processing chamber 2a when viewed from above. FIG. 5 is a block diagram showing the arrangement of a control circuit. The same reference numerals as in FIGS. 1, 2A, and 2B denote the same parts in FIGS. 3 to 5.

An example in which the carrier 6 is transported between the processing chambers 2b and 2a connected to each other will be explained in this embodiment. As shown in FIG. 3, the processing chamber 2a accommodates a first stop position sensor 301 for detecting the leading end of the carrier 6 at the stop position, and a second stop position sensor 305 for detecting the trailing end of the carrier 6 at the stop position.

A sensor 303 for detecting the leading end of the carrier 6 being transported is interposed between the first stop position sensor 301 and the second stop position sensor 305. When the sensor 303 detects the carrier 6, a processor 501 serving as a controller instructs a gate valve driving unit 505 to close the gate valve 4b. Note that an alternate long and short dashed line in FIG. 3 indicates the position of the carrier 6 when the sensor 303 has detected the leading end of the carrier 6.

In this embodiment, the processor 501 gives the instruction to close the gate valve 4b when the sensor 303 has detected the carrier 6, and starts closing the gate valve 4b before the carrier 6 reaches the stop position. The position of the sensor 303 is determined such that the trailing end of the carrier 6 does not collide with the gate valve 4b as the gate valve 4b starts closing in response to the detection signal from the sensor 303.

The processor 501 receives the detection signals from the first stop position sensor 301, second stop position sensor 305, and sensor 303, as shown in FIG. 5. In response to the detection signal of the carrier 6 from the sensor 303, the processor 501 outputs a control signal for instructing the gate valve driving unit 505 to close the gate valve 4b, as described above.

The processor 501 receives the detection signal of the carrier leading end from the first stop position sensor 301, and that of the carrier trailing end from the second stop position sensor 305, as described above. These two stop position sensors serve to confirm that the carrier 6 has reached the stop position in a processing chamber. When the sensors detect that the carrier 6 has reached the stop position, exhaust, gas introduction, and so on and subsequent predetermined processing are performed in the processing chamber 2a. At this stage, the gate valve 4b remains closed.

A motor driving unit 503 is connected to the processor 501, as shown in FIG. 5. The motor driving unit 503 electrically drives a motor (not shown) which rotates the magnetic screw 27 as the transport mechanism for the carrier 6. The motor driving unit 503 notifies the processor 501 of a driving completion signal upon transporting the carrier 6. Examples of the motor used herein are a servo motor and a stepping motor.

The processor 501 is notified of the driving completion signal upon the elapse of a predetermined operating time from when the carrier 6 starts to be transported from the processing chamber 2b until the carrier 6 is transported to the stop position in the processing chamber 2a, or of a time corresponding to a predetermined number of motor driving pulses. As a matter of course, the processor 501 may detect the operating time or the number of motor driving pulses. The processor 501 recognizes the completion of transportation of the carrier 6 to the stop position upon being notified of the driving completion. As described above, that the carrier has been transported to the stop position is not only detected based on the detection signals from the first and second stop position sensors, but also doubly confirmed based on the information of the driving completion.

As shown in FIG. 4, the processing chamber 2a includes the plurality of guide rollers 22 arrayed in a line in the middle of the processing chamber 2a, the side rollers 28 set on the two sides of each guide roller 22, and a shaft 405 connected to the magnetic screw 27 through a gear box 409. The processing chamber 2a also includes a bellows 407 set on the side of the processing chamber 2a of the shaft 405, the first stop position sensor 301 which detects the carrier 6 transported along the guide rollers 22, the sensor 303, and the second stop position sensor 305.

Each of the first stop position sensor 301, sensor 303, and second stop position sensor 305 can be an optical sensor (photo-interrupter) including a light-projecting unit and light-receiving unit. The position of the carrier 6 can be detected upon shielding, by the carrier 6, light which is always emitted by the light-projecting unit toward the light-receiving unit. Reference numerals 301a, 303a, and 305a denote light-projecting units of the first stop position sensor 301, sensor 303, and second stop position sensor 305, respectively. Also, reference numerals 301b, 303b, and 305b denote light-receiving units of the first stop position sensor 301, sensor 303, and second stop position sensor 305, respectively.

The shaft 405 is connected to the rotation shaft of a motor (not shown) which generates a rotating force outside the processing chamber 2a. This motor is driven by the motor driving unit 503 to rotate its rotation shaft, as described above. The gear box 409 transmits the power of the shaft 405 to the magnetic screw 27.

The processing chamber is one of, for example, a sputtering device, a reactive sputtering device, and a CVD device, and can include an exhaust unit and a gas introducing unit which introduces argon gas or a reactive gas (e.g., oxygen or nitrogen) although neither is shown.

The light-projecting unit 301a and light-receiving unit 301b of the first stop position sensor 301 are electrically connected to the processor 501, shown in FIG. 5, via a first port portion 401. Likewise, the light-projecting unit 303a and light-receiving unit 303b of the sensor 303 are electrically connected to the processor 501, shown in FIG. 5, via the first port portion 401. The light-projecting unit 305a and light-receiving unit 305b of the second stop position sensor 305 are electrically connected to the processor 501, shown in FIG. 5, via a second port portion 402. When the processor 501 confirms the detection signal from the sensor 303, it outputs a control signal to the gate valve driving unit 505 to close the gate valve 4b, as described above.

Upon receiving the driving completion signal from the motor driving unit 503, the processor 501 confirms that the carrier 6 is located at the stop position based on the detection signals from the first stop position sensor 301 and second stop position sensor 305. From the viewpoint of detecting a loss of synchronization upon transportation that exploits magnets, it is effective to confirm, by the processor 501, not only the driving completion signal but also the stop signals from the stop position sensors.

Figure 6:
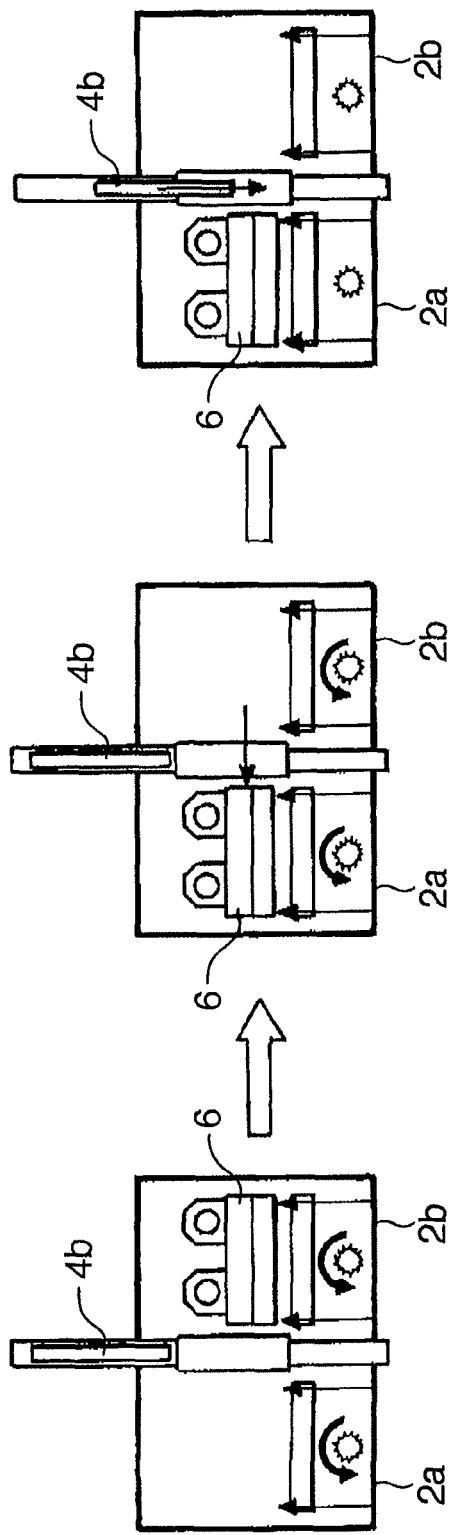
FIGS. 6A to 6C are explanatory views for explaining a conventional carrier transport operation.

FIGS. 6A to 6C are views for explaining conventional carrier transportation. A case shown in FIGS. 6A to 6C as a comparative example will be compared with the present invention. In the comparative example, when substrate processing in a processing chamber 2b is complete, a gate valve 4b is opened, and a transport mechanism transports a carrier 6 to a processing chamber 2a, as shown in FIG. 6A. With this operation, the carrier 6 reaches the stop position in the processing chamber 2a, as shown in FIG. 6B.

After it is confirmed that the carrier 6 has reached the stop position based on the detection signals from a first stop position sensor 301 and second stop position sensor 305, the gate valve 4b is closed, as shown in FIG. 6C. After that, a vacuum exhaust process and a process of introducing argon gas or a reactive gas start in the processing chamber 2a.

Figure 7:
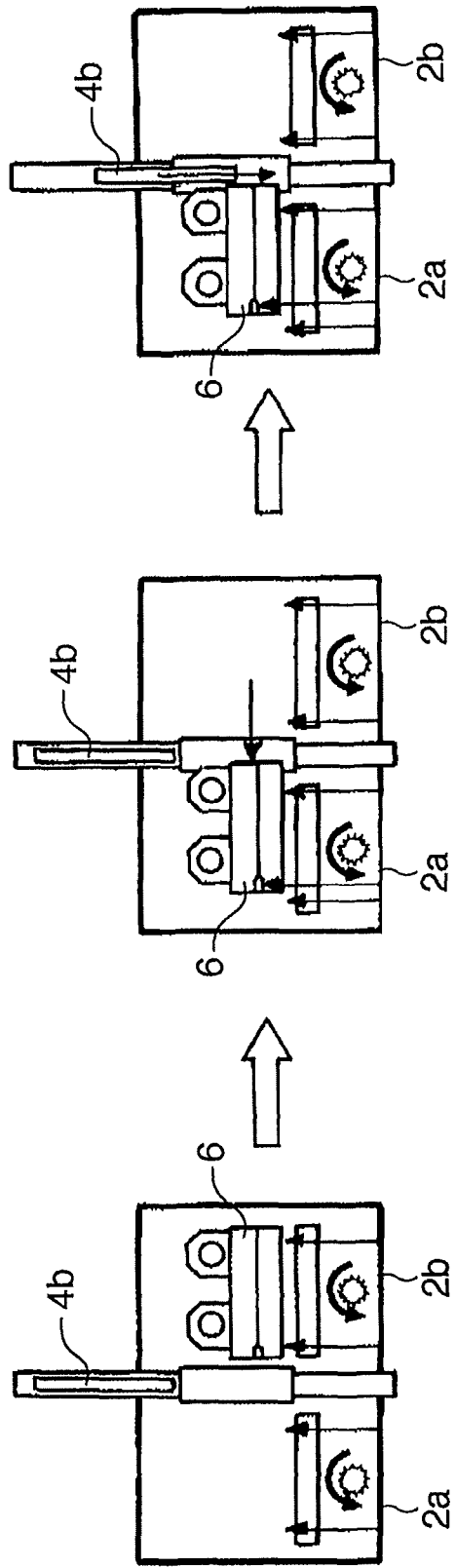
FIGS. 7A to 7C are explanatory views for explaining a carrier transport operation according to the preferred embodiment of the present invention.

FIGS. 7A to 7C are views for explaining a carrier transport operation when a gate valve is controlled using a sensor in accordance with the present invention. When substrate processing in a processing chamber 2b is complete, a gate valve 4b is opened, as shown in FIG. 7A. A carrier 6 is transported to a processing chamber 2a, as shown in FIG. 7B. At this time, when a sensor 303 detects the leading end of the carrier 6, the gate valve 4b starts closing before the carrier 6 reaches the stop position, as shown in FIG. 7C.

In this manner, in this embodiment, the gate valve starts closing before the carrier reaches the stop position in response to the detection signal from the sensor, advancing the time to close the gate valve. This makes it possible to shorten the processing time in a processing chamber, thus improving the throughput and the productivity.

The location position of a sensor light-shielding unit 6a as a part of the carrier 6 which shields the light traveling from the light-projecting unit 303a to the light-receiving unit 303b is not limited to the leading end of the carrier 6. The sensor light-shielding unit 6a can be located at an appropriate position in the carrier 6. This position is determined such that the carrier 6 does not collide with the gate valve 4b which is closed as the carrier 6 shields the light traveling from the light-projecting unit 303a to the light-receiving unit 303b. If the sensor light-shielding unit 6a is not located at the leading end of the carrier 6, a slit can be formed so as to run from the leading end to the sensor light-shielding unit 6a.

Also, although a case in which the carrier 6 is transported from the processing chamber 2b to the processing chamber 2a has been exemplified above, quite the same method of gate valve control is applied to a case in which the carrier 6 is transported between other chambers connected to each other.

Furthermore, although an improvement in throughput is attained by controlling the start of closing of the gate valve using a photo-interrupter as the sensor for detecting the carrier in the above-mentioned embodiment, the present invention is not limited to this. The sensor may be, for example, a proximity sensor or a physical switch. Alternatively, the sensor may be implemented by the processor 501. More specifically, the processor 501 can measure the operating time of the motor driving unit 503, that is, the operating time of the magnetic screw 27 which rotates by driving the motor driving unit 503 (the operating time from the start of carrier transportation), and instruct to close the gate valve 4b when the measured operating time has reached a preset operating time. When the processor 501 provides the function of the sensor, it can serve as both the sensor and the controller.

In this case, it is possible to start closing the gate valve 4b at a timing at which the operating time of the carrier transport mechanism has reached a preset operating time that continues until the first and second stop position sensors 301 and 305 detect the leading and trailing ends of the carrier 6 and that is long enough to prevent the carrier 6 from colliding with the gate valve 4b. In this manner, the processing time in a processing chamber can be shortened as well by starting closing the gate valve based on the operating time of the carrier transport mechanism.

The present invention may also be implemented by starting closing the gate valve when a detection signal is output from the sensor 303 and the operating time of the carrier transport mechanism has reached a preset operating time. In this manner, apparatus reliability can be further improved by doubly confirming that the carrier has reached a predetermined position.

The operating time of the carrier transport mechanism may also be measured by counting the number of pulses which drive a motor, such as the above-mentioned servo motor or stepping motor, that rotates the magnetic screw 27 serving as the transport mechanism for the carrier 6.

Next, an apparatus and method for manufacturing a magnetic recording medium, to which the substrate transport apparatus of the present invention is applied, will be explained. In this embodiment, a magnetic recording medium will be explained as an example of a thin-film stack. Note that in this specification, the term "magnetic recording medium" is not limited to an optical disk such as a hard disk or floppy (registered trademark) disk using only magnetism when recording and reading information. For example, a "magnetic recording medium" includes a magnetooptical recording medium such as an MO (Magneto Optical) disk using both magnetism and light, or a thermally assisted recording medium using both magnetism and heat.

Figure 8:
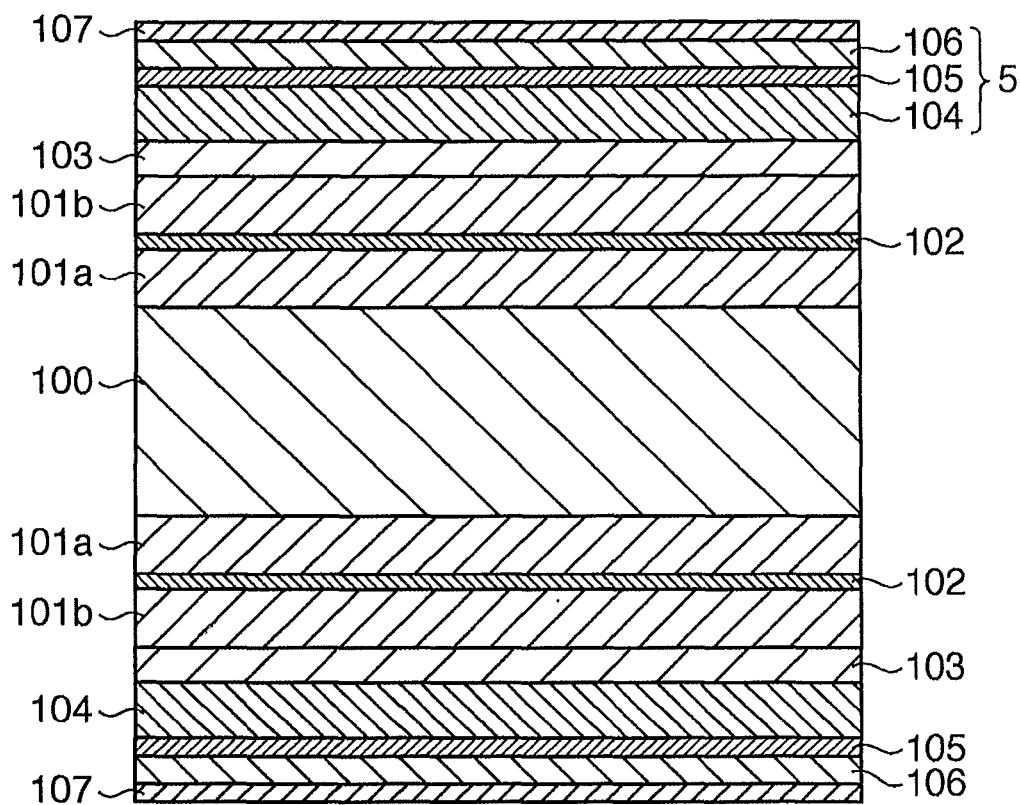
FIG. 8 is an exemplary longitudinal sectional view showing an example of a magnetic recording medium manufactured by the magnetic recording medium manufacturing apparatus and magnetic recording medium manufacturing method according to the embodiment of the present invention.

FIG. 8 is an exemplary longitudinal sectional view showing an example of a magnetic recording medium (thin film stack) manufactured by the magnetic recording medium manufacturing apparatus and magnetic recording medium manufacturing method according to the embodiment of the present invention. In this embodiment, an ECC (Exchange-Coupled Composite) medium obtained by improving a perpendicular recording medium will be explained as an example of the magnetic recording medium. However, the spirit and scope of the present invention are not limited to this example. For example, the magnetic recording medium may also be a general perpendicular recording medium, longitudinal recording medium, bit-patterned medium, or thermally assisted recording medium.

As shown in FIG. 8, the magnetic recording medium includes a substrate 100, and a first soft magnetic layer 101a, spacer layer 102, second soft magnetic layer 101b, seed layer 103, magnetic layer 104, exchange coupling control layer 105, third soft magnetic layer 106, and protective layer 107 sequentially stacked on one or both of the two surfaces of the substrate 100.

As the material of the substrate 100, it is possible to use a nonmagnetic material generally used as a magnetic recording medium substrate. Examples are glass, an Al alloy having an NiP plating film, ceramics, a flexible resin, and Si. In this embodiment, the substrate 100 is a disk-like member having a central hole. However, the present invention is not limited to this, and a rectangular member or the like may also be used.

The first soft magnetic layer 101a formed on the substrate 100 is a layer preferably formed to improve the recording/reproduction characteristics by controlling a magnetic flux from a magnetic head for use in magnetic recording. However, the first soft magnetic layer 101a may also be omitted. As the constituent material of the first soft magnetic layer 101a, it is possible to use, for example, CoZrNb, CoZrTa, or FeCoBCr.

As the material of the spacer layer 102, it is possible to use, for example, Ru or Cr. The second soft magnetic layer 101b formed on the spacer layer 102 is identical to the first soft magnetic layer 101a. The first soft magnetic layer 101a, spacer layer 102, and second soft magnetic layer 101b form a soft underlayer.

The seed layer 103 formed on the soft underlayer is a layer preferably formed immediately below the magnetic layer 104 in order to suitably control the crystal orientation, crystal grain size, grain size distribution, and grain boundary segregation of the magnetic layer 104. As the material of the seed layer 103, it is possible to use, for example, MgO, Cr, Ru, Pt, or Pd.

A magnetic recording layer 5 includes the magnetic layer 104 having a large Ku value, the exchange coupling control layer 105, and the third soft magnetic layer 106 having a small Ku value.

The magnetic layer 104 formed on the seed layer 103 and having a large Ku value affects the overall Ku value of the magnetic recording layer 5, so a material having a maximum possible Ku value is preferably used. As the material of the magnetic layer 104 which exhibits the above characteristic, it is possible to use a material having an easy magnetization axis perpendicular to the substrate surface, and having a structure in which ferromagnetic grains are isolated by the nonmagnetic grain boundary component of an oxide. For example, it is possible to use a material obtained by adding an oxide to a ferromagnetic material containing at least CoPt. Examples are CoPtCr—$SiO_2$ and CoPt—$SiO_2$. It is also possible to use $Co_{50}Pt_{50}$, $Fe_{50}Pt_{50}$ or $Co_{50-y}Fe_yPt_{50}$.

The exchange coupling control layer 105 formed on the magnetic layer 104 contains a crystalline metal or alloy, or an oxide. As the material of the crystalline metal or alloy, it is possible to use, for example, Pt, Pd, or an alloy of Pt or Pd. As the crystalline alloy, it is also possible to use, for example, an alloy of an element selected from Co, Ni, and Fe and a nonmagnetic metal. A material with low magnetization such as a CoCrB alloy may also be employed.

The strength of the exchange coupling force between the magnetic layer 104 and third soft magnetic layer 106 can most simply be controlled by changing the film thickness or composition of the exchange coupling control layer 105. The film thickness of the exchange coupling control layer 105 is desirably, for example, 0.5 to 2.0 nm.

The third soft magnetic layer 106 formed on the exchange coupling control layer 105 mainly functions to reduce the magnetization reversing magnetic field, so a material having a minimum possible Ku value is preferably used. As the material of the third soft magnetic layer 106, it is possible to use, for example, Co, NiFe, CoNiFe, or CoCrPtB.

The protective layer 107 formed on the third soft magnetic layer 106 is formed to prevent corrosion and damage caused by the contact between a head and the medium surface. As the protective layer 107, it is possible to use, for example, a film containing a single component such as C, $SiO_2$, or $ZrO_2$, or a film obtained by adding an additive element to C, $SiO_2$, or $ZrO_2$ as a main component.

Figure 9:
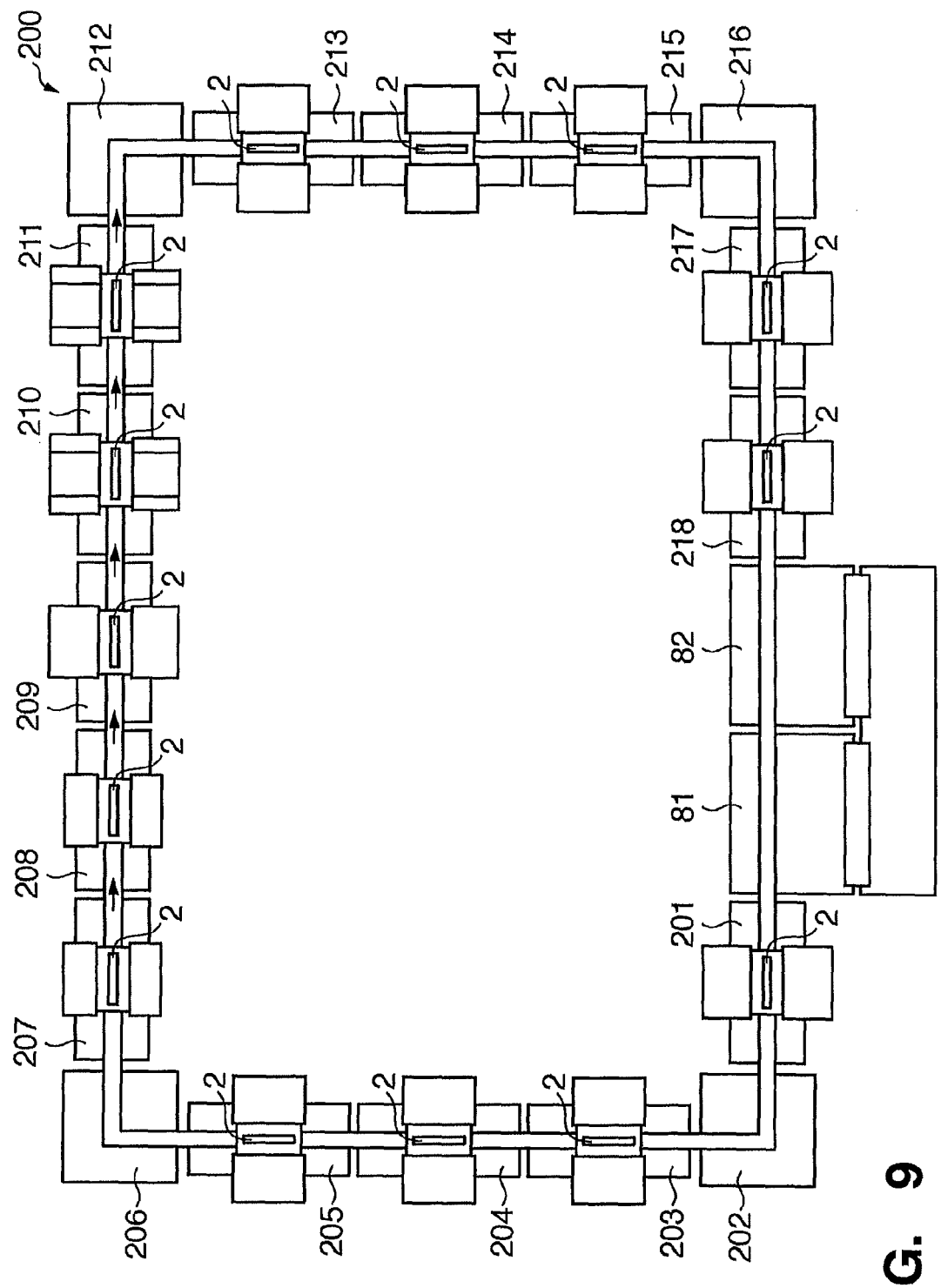
FIG. 9 is an exemplary view showing an example of the thin film formation apparatus or the magnetic recording medium manufacturing apparatus according to the embodiment of the present invention.
Figure 10:
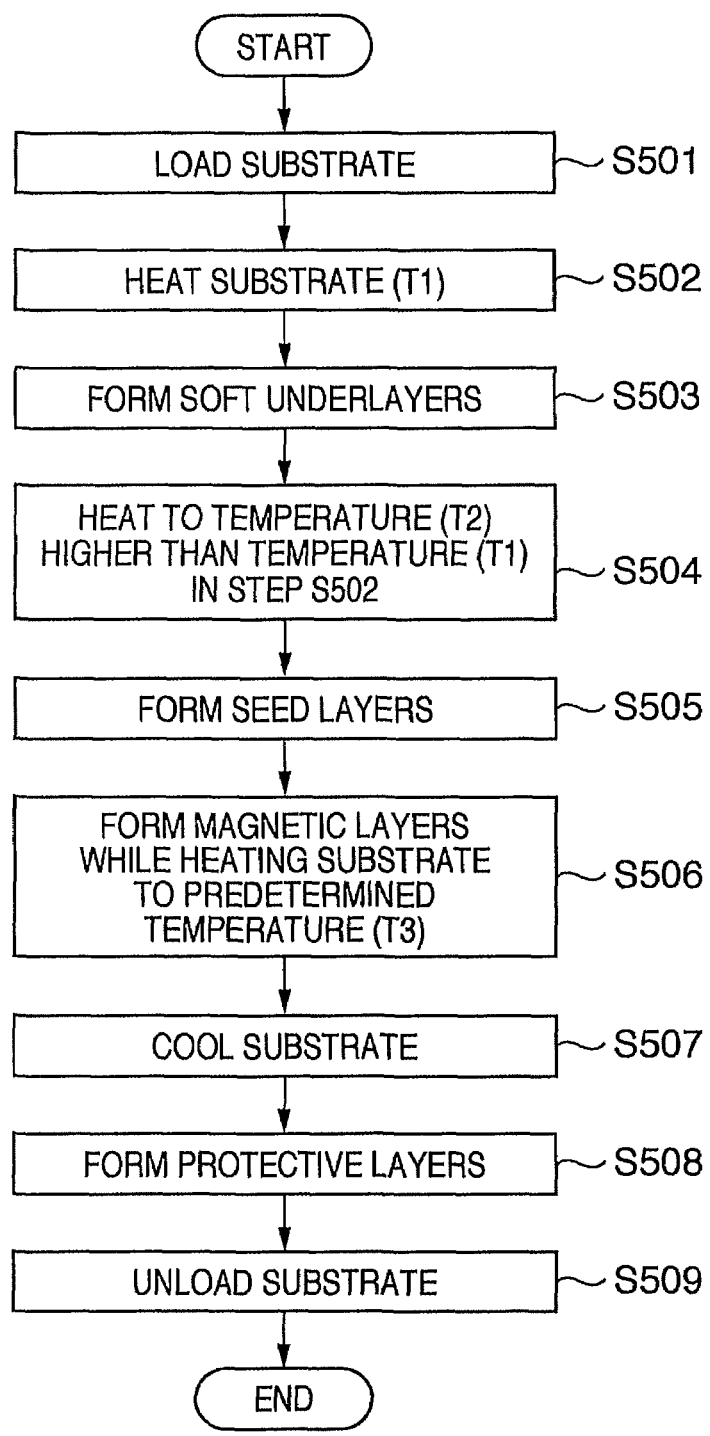
FIG. 10 is a flowchart for explaining the sequence of the magnetic recording medium manufacturing method.

A thin film formation apparatus (to be also referred to as a "magnetic recording medium manufacturing apparatus" hereinafter) used in the magnetic recording medium manufacturing method according to the embodiment of the present invention will be explained below. FIG. 9 is an exemplary view showing an example of the magnetic recording medium manufacturing apparatus according to the embodiment of the present invention. FIG. 10 is a flowchart for explaining the sequence of the magnetic recording medium manufacturing method.

In the magnetic recording medium manufacturing apparatus as shown in FIG. 9, a load lock chamber 81 for loading the substrate 100 (FIG. 1) on a carrier 2, an unload lock chamber 82 for unloading the substrate 100 from the carrier 2, and a plurality of chambers 201, 202, 203, 204, 205, 206, 207, 208, 209, 210, 211, 212, 213, 214, 215, 216, 217, and 218 are arranged along the contours of a rectangle. Also, a transfer path is formed along the load lock chamber 81, chambers 201 to 218, and unload lock chamber 82. The transfer path has a plurality of carriers 2 capable of carrying the substrate 100. In each chamber, a processing time (tact time) required for the processing of the substrate 100 is predetermined. When this processing time (tact time) has elapsed, the carriers 2 are sequentially transferred to the next chambers.

Each of the load lock chamber 81, the unload lock chamber 82, and the plurality of chambers 201, 202, 203, 204, 205, 206, 207, 208, 209, 210, 211, 212, 213, 214, 215, 216, 217, and 218 corresponds to the processing chamber 2a according to the present invention, and comprises the sensor 303 for detecting the carrier, the first stop position sensor 301, and second stop position sensor 305.

For the magnetic recording medium manufacturing apparatus to process about 1,000 substrates per hour, the tact time in one chamber is about 5 sec or less, desirably, about 3.6 sec or less.

Each of the load lock chamber 81, unload lock chamber 82, and chambers 201, 202, 203, 204, 205, 206, 207, 208, 209, 210, 211, 212, 213, 214, 215, 216, 217, and 218 is a vacuum chamber that can be evacuated by a dedicated or shared evacuating system. Gate valves (not shown) are formed in the boundary portions between the load lock chamber 81, unload lock chamber 82, and chambers 201, 202, 203, 204, 205, 206, 207, 208, 209, 210, 211, 212, 213, 214, 215, 216, 217, and 218.

More specifically, the chamber 201 of the magnetic recording medium manufacturing apparatus forms the first soft magnetic layer 101a on the substrate 100. The direction change chamber 202 changes the transfer direction of the carrier 2. The chamber 203 forms the spacer layer 102 on the first soft magnetic layer 101a. The chamber 204 forms the second soft magnetic layer 101b on the spacer layer 102. The chamber 205 forms the seed layer 103 on the second soft magnetic layer 101b. The direction change chamber 206 changes the transfer direction of the carrier 2. The magnetic recording medium manufacturing apparatus also includes the chamber 207 (a first heating chamber) and the chamber 208 (a second heating chamber) as preheating chambers for preheating the substrate 100. The chamber 209 can also form the seed layer 103.

The chambers 210 can function as sputtering apparatus for forming the magnetic layer 104 on the seed layer 103. The cooling chamber 211 cools the substrate 100 on which the magnetic layer 104 is formed. The direction change chamber 212 changes the direction of the carrier 2. The cooling chamber 213 further cools the substrate 100. The chamber 214 forms the exchange coupling control layer 105 on the magnetic layer 104. The chamber 215 forms the third soft magnetic layer 106 on the exchange coupling control layer 105. The direction change chamber 216 changes the direction of the carrier 2. The chambers 217 and 218 form the protective layer 107.

In the chamber 209 for forming the seed layer 103, two targets are installed facing each other. This makes it possible to form the seed layers 103 on the two surfaces of the substrate 100. As the target material for forming the seed layers 103, it is possible to use, e.g., Cr, MgO, Pt or Pd. Note that a turbo molecular pump (to be referred to as a "TMP" hereinafter) 31 for evacuating a chamber is connected to each of the chambers 209, 210, and 211.

The chamber 210 functions as a sputtering apparatus and forms the magnetic layers 104 on the substrate by sputtering target materials set in the chamber 210.

The above-mentioned magnetic layer material can be used as the material of the first target 42a, third target 42b, second target 43a, and fourth target 43b. For example, it is possible to use a material obtained by adding an oxide to a ferromagnetic material containing at least CoPt. Examples are CoPtCr—$SiO_2$ and CoPt—$SiO_2$. It is also possible to use $Co_{50}Pt_{50}$, $Fe_{50}Pt_{50}$, or $Co_{50-y}Fe_yPt_{50}$ as another target material.

For the magnetic recording medium manufacturing apparatus to process about 1,000 substrates per hour, the tact time in one chamber must be shortened to about 5 sec or less, desirably, about 3.6 sec or less as described previously.

Next, a magnetic recording medium manufacturing method using the magnetic recording medium manufacturing apparatus according to the embodiment of the present invention will be explained below with reference to FIGS. 8 and 10.

In step S501, a substrate is carried into the load lock chamber 81 and placed on the carrier 2 by a substrate transfer robot (not shown).

In step S502, the substrate is heated to a predetermined temperature T1 (about 100° C.) in the load lock chamber 81, thereby removing contaminants and water sticking to the substrate.

In step S503, soft underlayers are formed. More specifically, first soft magnetic layers 101a are formed in the chamber 201, spacer layers 102 (the thickness is 0.7 to 2 nm) are formed in the chamber 203, and second soft magnetic layers 101b are formed in the chamber 204.

In step S504, the substrate is sequentially transferred to the chamber 207 (first heating chamber) and chamber 208 (second heating chamber), and heated to a temperature T2 (about 400° C. to 700° C.) higher than the temperature T1 (about 100° C.) in step S502. This step is a preparation step of increasing the magnetic anisotropy of magnetic recording layers when forming magnetic layers 104 later. In the magnetic recording medium manufacturing apparatus, the processing time (tact time) in one chamber is limited in order to increase the throughput. In the chambers 210 for forming magnetic layers 104, it is difficult to heat the substrate to a temperature required to increase the magnetic anisotropy of magnetic layers 104 within the limited time. Therefore, the magnetic recording medium manufacturing apparatus includes the chamber 207 (first heating chamber) and chamber 208 (second heating chamber) for preheating (preliminary heating). In the magnetic recording medium manufacturing apparatus, the chamber 207 (first heating chamber) and chamber 208 (second heating chamber) function as preliminary heating means.

Since the substrate temperature decreases before the substrate is completely transferred to the chamber 210 for forming magnetic layers 104, the substrate must be heated (preliminarily heated) in the chamber 207 (first heating chamber) and chamber 208 (second heating chamber) to a temperature equal to or higher than the temperature required to increase the magnetic anisotropy in the chamber 210. If the substrate made of glass is overheated, however, it may plastically deform and fall from the carrier 2. In the chamber 207 (first heating chamber) and chamber 208 (second heating chamber), therefore, the glass substrate is preferably heated to a temperature below where plastic deformation occurs. For some glass substrates this may be up to, for example, 600° C.

In step S505, seed layers 103 are formed to suitably control the crystal characteristics of magnetic layers 104. Note that the seed layers 103 may also be formed in the chamber 205 before the heating step in step S504.

In step S506, the substrate is transferred to the chambers 210 for forming magnetic layers 104, and magnetic layers 104 are formed while the substrate is heated to a predetermined temperature T3 (about 400° C. to 600° C.). In this step, the magnetic layers 104 are formed while the substrate is uniformly heated in the chamber 210 as described previously.

In step S507, the substrates are sequentially transferred to the cooling chambers 211 and 213 and cooled to a temperature optimum for the formation of protective layers 107. When using carbon as the material of the protective layers 107, the substrate must be cooled to, for example, about 200° C. or less.

In step S508, the substrate is transferred to the chambers 217 and 218 for protective layers 107 deposition which may be formed by CVD.

Note that ultra-thin exchange coupling control layers 105 may also be formed between the magnetic layers 104 and protective layers 107 in the chamber 214. Note also that third soft magnetic layers 106 may also be formed in the chamber 215 after the substrate is cooled and before the protective layers 107 are formed.

Finally, in step S509, the substrate is unloaded as it is removed from the carrier 2 in the unload lock chamber 82.

As explained above, this embodiment can provide a magnetic recording medium manufacturing method capable of performing uniform temperature control on substrate surfaces.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-276821, filed Oct. 28, 2008, and No.

2009-232524, filed Oct. 6, 2009, which are hereby incorporated by reference herein in their entirety.

What is claimed is:

1. A substrate transport apparatus comprising:
first and second chambers connected to each other through a gate valve;
a transport mechanism configured to transport a carrier from the first chamber to the second chamber along a transport path in a state that the gate valve is opened;
a first stop position sensor configured to detect a leading end of the carrier in the second chamber when the carrier reaches a stop position in the second chamber;
a second stop position sensor positioned to detect a trailing end of the carrier in the second chamber when the carrier reaches the stop position;
a sensor located at a position between the first stop position sensor and the second stop position sensor and positioned to detect the carrier before the carrier reaches the stop position; and
a controller configured to cause the gate valve to start closing, based on a detection signal from the sensor, before the carrier reaches the stop position, and to perform a control so that a predetermined processing is performed in the second chamber.

2. The apparatus according to claim 1,
wherein the sensor is located at a position where the carrier does not collide with the gate valve when the gate valve is closed based on the detection signal from the sensor.

* * * * *